US008399982B2

(12) United States Patent
Wyland

(10) Patent No.: US 8,399,982 B2
(45) Date of Patent: Mar. 19, 2013

(54) NANOTUBE-BASED DIRECTIONALLY-CONDUCTIVE ADHESIVE

(75) Inventor: Chris Wyland, Livermore, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 554 days.

(21) Appl. No.: 11/718,713

(22) PCT Filed: Nov. 4, 2005

(86) PCT No.: PCT/IB2005/053626
§ 371 (c)(1),
(2), (4) Date: Feb. 2, 2009

(87) PCT Pub. No.: WO2006/048847
PCT Pub. Date: May 11, 2006

(65) Prior Publication Data
US 2009/0127712 A1 May 21, 2009

Related U.S. Application Data

(60) Provisional application No. 60/625,427, filed on Nov. 4, 2004.

(51) Int. Cl.
H01L 23/04 (2006.01)
H01L 23/34 (2006.01)
(52) U.S. Cl. .... 257/698; 257/723; 257/724; 257/E51.04
(58) Field of Classification Search ............ 257/E51.04, 257/698, 723, 724, 777
See application file for complete search history.

(56) References Cited

U.S. PATENT DOCUMENTS 5,529,950 A * 6/1996 Hoenlein et al. ............. 438/107
5,805,424 A * 9/1998 Purinton ....................... 361/760
6,340,822 B1 * 1/2002 Brown et al. ................... 257/25
6,383,923 B1   5/2002 Brown et al.
6,984,579 B2 * 1/2006 Nguyen et al. ............... 438/622
7,115,305 B2 * 10/2006 Bronikowski et al. ...... 427/249.1
7,453,154 B2 * 11/2008 Teo et al. ...................... 257/777
7,727,814 B2 * 6/2010 Suh et al. ..................... 438/119
(Continued)

FOREIGN PATENT DOCUMENTS

JP          4366630       12/1992
JP        2001-172582      6/2001
(Continued)

OTHER PUBLICATIONS

European Patent Office—International Searching Authority; International Search Report mailed Mar. 13, 2006; PCT International Application No. PCT/IB2005/053626; 2 pages, NL—HV Rijswijk.

(Continued)

Primary Examiner — Teresa M Arroyo
(74) Attorney, Agent, or Firm — Haynes and Boone, LLP

(57) ABSTRACT

A tape adhesive type material is directionally conductive. According to an example embodiment of the present invention, carbon nanotubes (212, 214, 216, 218) are configured in a generally parallel arrangement in a tape base type material (210). The carbon nanotubes conduct (e.g., electrically and/or thermally) in their generally parallel direction and the tape base type material inhibits conduction in a generally lateral direction. In some implementations, the tape base material is arranged between integrated circuit components (220, 230), with the carbon nanotubes making a conductive connection there between. This approach is applicable to coupling a variety of components together, such as integrated circuit dies (flip chip and conventional dies) to package substrates, to each other and/or to leadframes.

21 Claims, 2 Drawing Sheets

U.S. PATENT DOCUMENTS

| | | | |
|---|---|---|---|
| 7,800,138 B2 * | 9/2010 | Baek et al. | 257/211 |
| 2001/0023986 A1 * | 9/2001 | Mancevski | 257/741 |
| 2004/0058153 A1 | 3/2004 | Ren et al. | |
| 2004/0227447 A1 * | 11/2004 | Yaniv et al. | 313/309 |
| 2005/0142933 A1 * | 6/2005 | Beer et al. | 439/540.1 |
| 2005/0167647 A1 * | 8/2005 | Huang et al. | 257/14 |
| 2005/0189655 A1 * | 9/2005 | Furukawa et al. | 257/762 |
| 2005/0230270 A1 * | 10/2005 | Ren et al. | 205/777.5 |
| 2006/0043598 A1 * | 3/2006 | Kirby et al. | 257/774 |
| 2006/0228140 A1 * | 10/2006 | Swift et al. | 399/411 |
| 2006/0243958 A1 * | 11/2006 | Suh et al. | 257/10 |
| 2006/0274049 A1 * | 12/2006 | Spath et al. | 345/173 |
| 2007/0004081 A1 * | 1/2007 | Hsiao | 438/106 |
| 2007/0059864 A1 * | 3/2007 | Huang et al. | 438/118 |

FOREIGN PATENT DOCUMENTS

| | | |
|---|---|---|
| JP | 2003-109691 | 4/2003 |
| WO | WO 2006048846 A2 * | 5/2006 |

OTHER PUBLICATIONS

Korean Patent Office, Office Action mailed Oct. 28, 2011 with English Translation; Application No. 2007-7010095, 10 pages.

M.S. Dresselhause, et al., Science of Fullerences and Carbon Nanotubes, 1996, 1-979 pgs, Academic Press, San Diego.

* cited by examiner

NANOTUBE-BASED DIRECTIONALLY-CONDUCTIVE ADHESIVE

The present invention is directed to integrated circuit devices and approaches and, more particularly, to applications involving adhesive products.

The integrated circuit industry has experienced technological advances that have permitted dramatic increases in circuit density and complexity, and equally dramatic decreases in the size of circuit components and circuit arrangements. These technology advances have promulgated equally dramatic growth in the industry and corresponding demand for products employing high-density, complex and compact integrated circuit devices.

To meet the needs of such high-density and high functionality, increased numbers of external electrical connections are implemented with circuit chips, on the exterior of the chips and on the exterior of the semiconductor packages that receive the chips and for connecting packaged devices together. The electrical conductivity (and any associated losses or delays) of connections with the circuit chips have become increasingly important as higher demands for speed and efficiency are promulgated with many applications. Externally-implemented connectors have been used to electrically connect different circuit components such as bonded chips, flip chips, package substrates, ball grid array (BGA) substrates and pin grid array (PGA) substrates. These electrical connections facilitate the transfer of signals between the circuit components for a variety of purposes. Achieving desirable circuit connection characteristics has been challenging, however, while meeting such other factors.

In addition, there is often a need for greater power consumption to power such increased numbers of circuits. Increased density and/or power consumption generally leads to increased heat generation, which can pose potential problems for circuit components. In addition, as the size of circuit arrangements (and, correspondingly, components associated with circuit arrangements) is reduced, these circuit arrangements are often placed under increased heat-related stress.

These and other difficulties present challenges to the implementation of circuit substrates for a variety of applications.

Various aspects of the present invention involve circuit connection approaches implemented with integrated circuits and other devices. The present invention is exemplified in a number of implementations and applications, some of which are summarized below.

According to an example embodiment, carbon nanotubes are used to electrically couple integrated circuit dies to external circuits such as package substrates.

In another example embodiment of the present invention, carbon nanotubes are implemented with a tape adhesive type of material, with the carbon nanotubes arranged in a generally vertical direction, relative to a length of the tape adhesive type of material.

In one implementation, the above-discussed tape adhesive type of material is arranged between integrated circuit devices, with the carbon nanotubes electrically coupling the integrated circuit devices. This approach is applicable, for example, with vertically-arranged integrated circuit devices, with the tape adhesive type of material arranged between and extending along facing surfaces of the integrated circuit devices, and the carbon nanotubes extending in a vertical direction. In some applications, the tape adhesive type of material is arranged between interconnect lines at facing surfaces of the integrated circuit devices (e.g., a die and a substrate), with the carbon nanotubes electrically coupling the interconnect lines.

Various devices and approaches are manufactured and/or implemented in other example embodiments, with flip chip devices, conventional devices, leadframes and others, and with various connector approaches including direct connection to surface contacts of devices and indirect connection via connectors such as those implemented with a leadframe.

The above summary of the present invention is not intended to describe each illustrated embodiment or every implementation of the present invention. The figures and detailed description that follow more particularly exemplify these embodiments.

The invention may be more completely understood in consideration of the following detailed description of various embodiments of the invention in connection with the accompanying drawings, in which.

Figure 1:
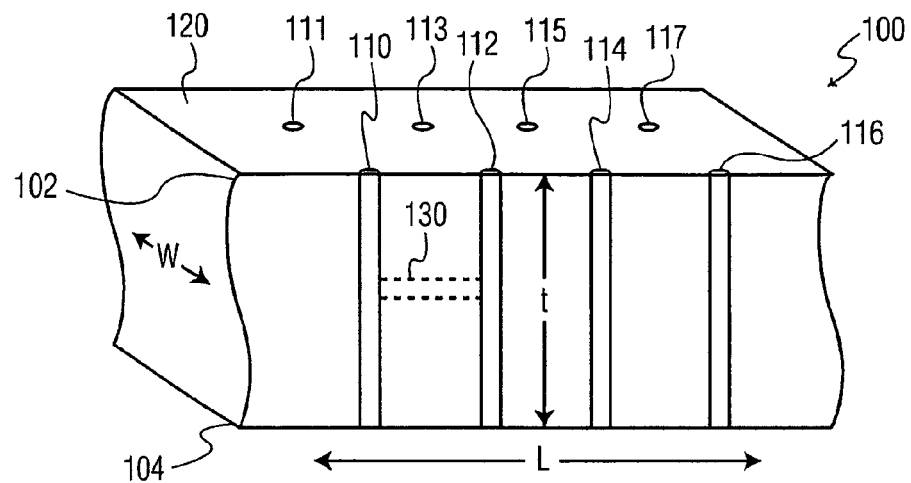
FIG. 1 shows a cross-sectional view of a directionally-conductive tape type of material, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention as defined by the appended claims.

The present invention is believed to be applicable to a variety of circuits and approaches involving and/or benefiting from the electrical connection of integrated circuit components. While the present invention is not necessarily limited to such applications, an appreciation of various aspects of the invention is best gained through a discussion of examples in such an environment.

According to an example embodiment of the present invention, carbon nanotubes are arranged in a directionally conductive tape type material for electrically and thermally conducting between surfaces of the tape type material. The tape type of material has a length, width and thickness, and the carbon nanotubes are arranged in a direction that is generally perpendicular to the length and width, in the direction of the thickness. Base material including, e.g., adhesives, plastics and/or insulative material in the tape support and, in some instances, separate the carbon nanotubes in their arrangement.

According to another example embodiment of the present invention, a carbon nanotube enhanced conductive tape is adapted for electrically coupling integrated circuit components. The tape has a length, width and thickness, with adhesive material located at opposite surfaces of the tape, relative to the thickness (i.e., when the length and width are oriented laterally, upper and lower surfaces of the tape include the adhesive material). When placed between integrated circuit components, such as between dies, between a die and a substrate in flip chip applications or between interconnects, the adhesive material adheres the tape to the integrated circuit components and the tape thus adheres the integrated circuit components together.

Carbon nanotubes (i.e., filaments) extend in the general direction of the thickness of the tape, with individual carbon nanotubes extending between each of opposing surfaces of the tape. Where the tape is placed on a conductor such as an interconnect, the carbon nanotubes make electrical contact thereto. Where opposing interconnects on each integrated circuit align with one another, the carbon nanotubes in the tape electrically couple the opposing interconnects.

In another example embodiment, an adhesive tape with vertically-arranged carbon nanotubes extending across the thickness has lateral carbon nanotubes arranged to couple carbon nanotubes that extend across the thickness of the adhesive tape. With this approach, electrical connection is made to offset locations across the tape. In this regard, when the tape adhesive type of material is coupled, e.g., to opposing integrated circuit components, offset connectors on the integrated circuit components can be electrically coupled using the connection between nanotubes.

In some example embodiments, carbon nanotubes are arranged across the thickness of an adhesive tape at a relatively fine pitch (small distance between the carbon nanotubes). The carbon nanotubes implemented with these embodiments are significantly longer than they are wide. In this regard, the carbon nanotubes facilitate close arrangement and, correspondingly, connection between closely-arranged connectors when the tape is used to couple integrated circuit components together. In some applications, such as for coupling, an integrated circuit die to a BGA substrate, the carbon nanotubes are arranged at a lateral spacing (pitch) of less than about 150 microns, and in other instances, less than about 100 microns. In other relatively smaller scale applications, such as for coupling substrates having conductors formed using lithography techniques, the carbon nanotubes are arranged at a pitch of less than about 10 microns. In other applications that are relatively smaller yet, a carbon nanotube pitch of less than about 1 micron is implemented, and in still other applications, a carbon nanotube pitch of less than about 10 nanometers is implemented. With these approaches, connection between a variety of different types of circuit connectors is facilitated.

Carbon nanotubes used in connection with an adhesive tape type material as described herein can be arranged in the tape using a variety of approaches. In some implementations, carbon nanotubes are grown in a generally vertical direction from a material used in the tape. Catalyst material is arranged where growth is desirable, and a carbon-containing gas is introduced to the catalyst material. Carbon nanotubes are grown extending generally away from the catalyst material. After growth, area around the carbon nanotubes is filled with base material including, e.g., one or more of adhesives, compliant plastics and insulative material. Surfaces of the tape are arranged with an adhesive, using e.g., an adhesive base material and/or adding an adhesive material at the surface.

In other implementations, carbon nanotubes are grown and separated for use in the adhesive tape. The separated carbon nanotubes are arranged vertically, relative to a length of the tape, and area around the separated carbon nanotubes is filled as discussed above.

For general information regarding carbon nanotubes and for specific information regarding carbon nanotube growth approaches that can be implemented in connection with the example embodiments of the present invention, reference may be made to M. S. Dresselhaus, G. Dresselhaus, and P. C. Eklund, "Science of Fullerenes and Carbon Nanotubes" (Academic Press, San Diego, 1996), which is fully incorporated herein by reference.

Turning now to the figures, FIG. 1 shows a cross-sectional view of a directionally-conductive tape type material 100, according to an example embodiment of the present invention. The tape type material 100 has upper and lower surfaces 102 and 104, respectively, with several carbon nanotubes extending between the upper and lower surfaces. Carbon nanotubes 110, 112, 114 and 116 are shown in the cross-section, with additional carbon nanotubes 111, 113, 115 and 117 shown with an upper exposed portion, all insulated by base material 120. The carbon nanotubes extend in the direction of the thickness of the tape type material 100, represented by dimension "t" and extending generally vertical, relative lateral "L" and width "W" directions of the tape.

The carbon nanotubes extend from an upper surface 102 to a lower surface 104 of the tape type material 100 and conduct heat and/or electricity across the thickness "t." The base material 120 insulates the carbon nanotubes, thus mitigating (e.g., reducing, inhibiting or preventing) conduction in lateral and width directions ("L" and "W") of the tape type material 100.

In some implementations, the upper and/or lower surfaces 102 and 104 (respectively) include an adhesive material for adhering to integrated circuit components, such as chips or substrates. In some applications, a separate adhesive material is formed at one or both of the surfaces 102 and 104. In other applications, the base material 120 is adhesive.

The base material 120 includes one or more of a variety of materials, depending upon the application, available materials and desirable characteristics. As discussed above, the base material 120 may include an adhesive material to facilitate coupling to integrated circuit components. In this regard, a variety of adhesives may be used. Where applications desirably involve a flexible tape type material, the base material 120 is a generally flexible material. Where the tape type material 100 is implemented with uneven surfaces of integrated circuit components, or where a pliable material is otherwise desired, the base material 120 is a conforming material adapted to push, or squeeze, around and/or in surface configurations of the integrated circuit components. With these and other approaches, materials used for the base material 120 may include one or more of: plastics, adhesives, glues, epoxies, thermoplastics, silicone, grease, oil and resin. Further, filler materials are selectively used with the base material 120 for a variety of purposes, such as stability or thermal conductivity, and may include materials such as silica and carbon nanotube dust.

In another example embodiment, a lateral conductive connection is made between carbon nanotubes in the tape type material 100. By way of example (and accordingly shown with dashed lines), a lateral conductive connector 130 extends between carbon nanotubes 110 and 112. The lateral conductive connector 130 can be implemented using a carbon nanotube or other conductive material. Further, the lateral conductive connector may be extended to couple three or more carbon nanotubes, to couple carbon nanotubes in a width "W" direction or to couple non-adjacent carbon nanotubes (e.g., to couple carbon nanotubes 110 and 114 without necessarily coupling carbon nanotube 112).

Figure 2:
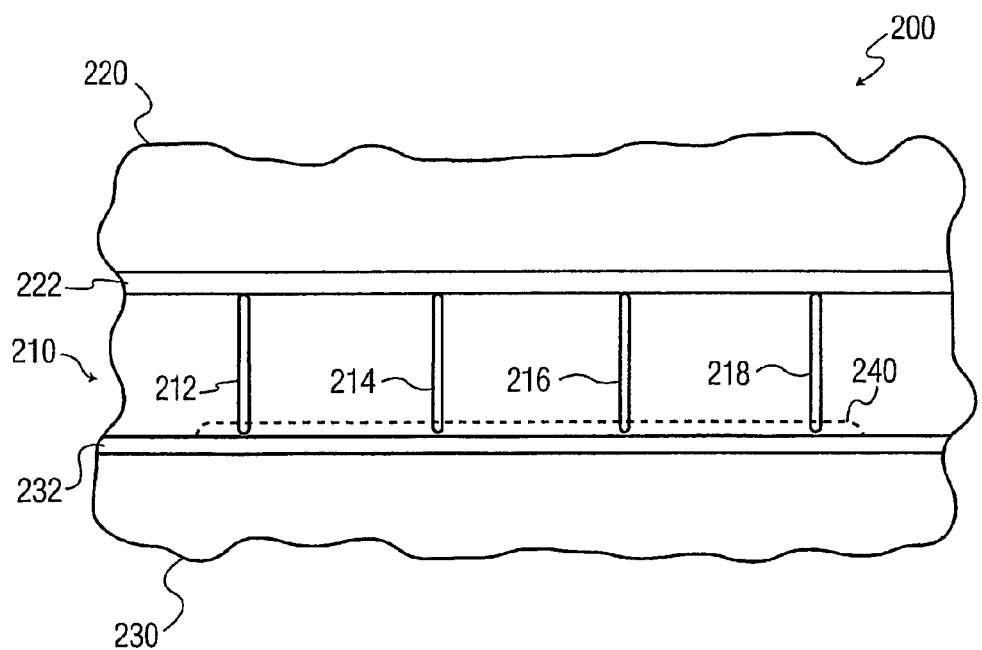
FIG. 2 shows a cross-sectional view of an integrated circuit package arrangement coupled with a carbon nanotube-based tape material, according to another example embodiment of the present invention.

FIG. 2 shows a cross-sectional view of an integrated circuit package arrangement 200 coupled with a carbon nanotube-based tape 210, according to another example embodiment of the present invention. The tape 210 can be implemented using approaches similar to those discussed above in connection with the tape type material 100 in FIG. 1. Opposing integrated circuit components 220 and 230 are arranged with conductors (i.e., interconnects) 222 and 232, respectively, facing each other and separated by the tape 210.

Carbon nanotubes in the tape 210 electrically couple the conductors 222 and 232 when the respective integrated circuit components 220 and 230 are pressed together with the tape 210 therebetween. Representative carbon nanotubes 212, 214, 216 and 218 are shown extending in a generally vertical direction and correspondingly conduct (electrically and/or thermally) in the vertical direction between the integrated circuit components 220 and 230. The carbon nanotubes are separated by a pitch (i.e., distance) "p" that is facilitated by the relative nano-scale size of the carbon nanotubes. The pitch "p" can be selected to suit particular needs, such as to provide connection to relatively close lateral connectors without necessarily electrically coupling the connectors. Additional examples involving the selection and arrangement of carbon nanotubes as relative to their pitch "p" are discussed further below with FIG. 3.

The integrated circuit components 220 and 230 can be arranged for use with a variety of applications, such as flip chip applications, die to substrate applications and other general connections between interconnects on different components or chips. For example, where implemented with flip chip application, the integrated circuit component 220 is a flip chip die and the integrated circuit component 230 is a package substrate, with the carbon nanotubes 212, 214, 216 and 218 electrically coupling the circuit side (222) of the integrated circuit die with the package substrate (232). For leadframe approaches, the integrated circuit components 220 and 230 can respectively be implemented with an integrated circuit chip and leadframe.

In another example embodiment, a conductive pad 240 is arranged at the conductor 232. The conductive pad includes a ductile metal having characteristics that facilitate the embedding of ends of the carbon nanotubes 212, 214, 216 and 218 in the conductive pad. This embedding of the carbon nanotubes facilitates conductive connection between the carbon nanotubes and the conductor 232 and, further, can be implemented to strengthen physical coupling between the tape 210 and the integrated circuit component 230. For general information regarding carbon nanotube conductors, and for specific information regarding approaches to embedding carbon nanotubes into a conductor, reference may be made to abandoned U.S. Provisional Patent Application Ser. No. 60/625,413, filed on Nov. 4, 2004, titled, "Nanotube-Based Connection Arrangement and Approach," of Chris Wyland, and fully incorporated herein by reference.

Figure 3:
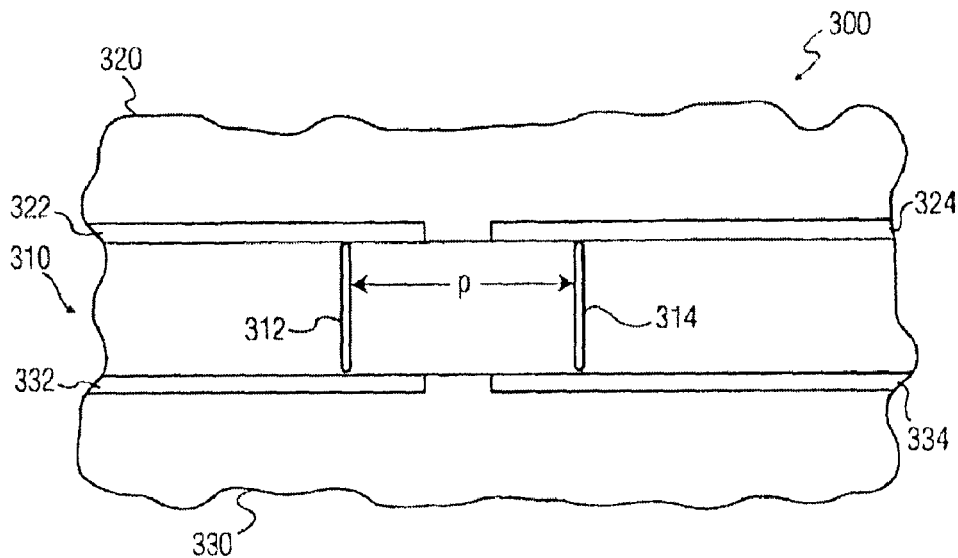
FIG. 3 shows a cross-sectional view of an integrated circuit package arrangement with fine pitch connectors separately coupled with carbon nanotube-based tape material, according to another example embodiment of the present invention.

FIG. 3 shows a cross-sectional view of an integrated circuit package arrangement 300 with fine pitch connectors separately coupled with carbon nanotube-based tape material, according to another example embodiment of the present invention. The integrated circuit package arrangement 300 has upper and lower integrated circuit components 320 and 330, respectively, with circuit connectors facing each other. A carbon nanotube-based tape 310 is located between the upper and lower integrated circuit components 320 and 330, electrically coupling the integrated circuit components together at selected locations. This tape 310 may be implemented using, e.g., approaches similar to those discussed above in connection with FIG. 1.

The upper integrated circuit component 320 has interconnects 322 and 324, and the lower integrated circuit component 330 has corresponding interconnects 332 and 334. The carbon nanotube-based tape 310 has vertically-arranged carbon nanotubes 312 and 314 respectively arranged to couple interconnects 322 and 332 together, and to couple interconnects 324 and 334 together. The carbon nanotubes 312 and 314 (and others in the tape, with a portion of a cross-section being shown) are spaced at a pitch "p" that facilitates the separate coupling of the adjacent interconnects on each integrated circuit component. That is, the nature of the tape 310 promotes vertical conduction and mitigates, or inhibits, lateral conduction, such that separate connection can be made between the interconnects 322 and 332, and the interconnects 324 and 334, respectively and at a relatively small pitch. In some applications, the pitch "p" is less than about 100 microns (e.g. for integrated circuit chip to BGA substrate connection). In other applications, the pitch "p" is less than about 1 micron and, in still other applications such as integrated circuit die-to-die connection, the pitch "p" is less than about 10 nanometers.

Figure 4:
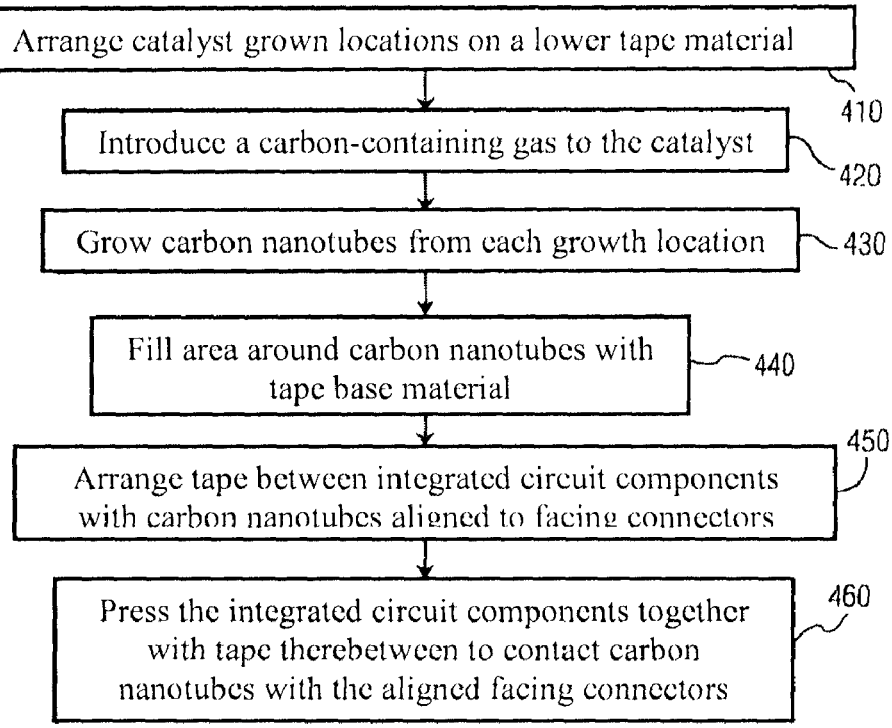
FIG. 4 is a flow diagram for an approach to manufacturing an integrated circuit device, according to another example embodiment of the present invention.

FIG. 4 is a flow diagram for an approach to manufacturing an integrated circuit device, according to another example embodiment of the present invention. At block 410, catalyst growth locations are arranged on a lower tape material such as an outer tape surface type of material. The catalyst growth locations are spaced apart at a pitch, or distance, selected for connection to integrated circuit components (e.g., the pitch corresponds to distance between integrated circuit connectors on a particular integrated circuit chip). At block 420, a carbon-containing gas is introduced to the catalyst material under conditions that promote carbon nanotube growth (e.g., via chemical vapor deposition (CVD)). At block 430, carbon nanotubes are grown from each growth location and an insulative tape base material is formed around the grown carbon nanotubes at block 440. The insulative tape base material may be implemented, for example, using one or more of the materials discussed above, facilitating the coupling of the tape base material to integrated circuit components while mitigating, or inhibiting, electrical conduction in a generally lateral direction (i.e., between carbon nanotubes).

After the carbon nanotubes are grown and the tape base material filled in around the carbon nanotubes, the tape is ready for implementation with integrated circuit components. In this regard, the tape is arranged between integrated circuit components at block 450, with the grown carbon nanotubes aligned to facing connectors on the integrated circuit components (e.g., as shown in FIGS. 2 and 3). The integrated circuit components are pressed together at block 460, with the aligned carbon nanotubes electrically contacted with the aligned facing connectors. In some applications, the pressing at block 460 involves embedding one or both ends of the carbon nanotubes into a ductile type material in an approach similar to that discussed in connection with material 240 in FIG. 2. Once pressed together, the tape facilitates a directionally-specific conductivity between the integrated circuit components, promoting thermal and electrical conductivity between the aligned connectors on the integrated circuit components.

The various embodiments described above and shown in the figures are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. For example, the carbon nanotubes may be implemented with material different from, or in addition to, carbon, such as Boron. In addition, the interface arrangements discussed by way of example may be implemented with a multitude of different types of materials, arrangements and orientations. Such modifications and changes do not depart from the true spirit and scope of the present invention.

What is claimed is:

1. An integrated circuit arrangement comprising:
   upper and lower integrated circuit components, each component having conductive connectors at an outer surface thereof that faces the other of the upper and lower integrated circuit components; and
   a directionally-conductive tape coupled to and extending laterally between the upper and lower integrated circuit components, the directionally-conductive tape comprising:
      an upper surface having an uppermost surface and an opposing lower surface having a lowermost surface;
      a plurality of carbon nanotubes extending vertically from the lowermost surface to the upper most surface and adapted to conduct electricity between conductive connectors on the upper and lower integrated circuit components;
      an insulative base material laterally around the carbon nanotubes and adapted to electrically insulate the carbon nanotubes; and
      a lateral conductive connector disposed within the insulative base material and extending horizontally between the upper and lower surfaces and adapted to couple a first one of the carbon nanotubes with a second one of the carbon nanotubes;
      wherein each of the upper and lower surfaces of the directionally-conductive tape comprises adhesive material configured and arranged for adhering to a respective one of the integrated circuit components, and
      wherein the lateral conductive connector is a carbon nanotube.

2. The arrangement of claim 1, wherein the insulative base material inhibits lateral conduction in the tape.

3. The arrangement of claim 1, wherein the insulative base material includes at least one of: plastic, silicone, epoxy, thermoplastic and glue.

4. The arrangement of claim 1, wherein at least some of the carbon nanotubes are spaced apart at a pitch of less than about 1 micron.

5. The arrangement of claim 1, wherein at least some of the carbon nanotubes are spaced apart at a pitch of less than about 10 nanometers.

6. The arrangement of claim 1, wherein the conductive connector at an outer surface of at least one of the integrated circuit components is an interconnect.

7. The arrangement of claim 1, wherein the conductive connector at an outer surface of at least one of the integrated circuit components is a conductive pad electrically coupled to circuitry in the at least one of the integrated circuit components.

8. The arrangement of claim 7, wherein an end of at least one of the carbon nanotubes is embedded in the conductive connector.

9. The arrangement of claim 8, wherein the directionally-conductive tape is adhered to the at least one of the integrated circuit components via the embedding of the end of the at least one of the carbon nanotubes.

10. The arrangement of claim 8, wherein a plurality of the carbon nanotubes are embedded in respective conductive connectors at both of the upper and lower integrated circuit components.

11. The arrangement of claim 8, wherein the carbon nanotube is embedded in ductile metal in the conductive connector.

12. The arrangement of claim 1, wherein the upper circuit component is an integrated circuit die and wherein the lower circuit component is a substrate.

13. The arrangement of claim 12, wherein the upper circuit component is a flip chip die having a circuit side opposite a back side and a plurality of connectors at an outer surface of the circuit side, and wherein the lower circuit component is a package substrate adapted for electrical connection to the flip chip die, the circuit side of the flip chip die being face-down on the tape.

14. The arrangement of claim 1, wherein adjacent ones of the carbon nanotubes couple different conductive connectors at the outer surface of the upper integrated circuit component with different conductive connectors of the lower integrated circuit component.

15. The arrangement of claim 1, wherein the lateral conductive connector is laterally surrounded by the insulative base material.

16. The arrangement of claim 1, wherein the first and second carbon nanotubes coupled by the lateral conductive connector are non-adjacent.

17. A device comprising:
   upper and lower integrated circuit components, each component having conductive connectors at an outer surface thereof that faces the other of the upper and lower integrated circuit components; and
   a tape extending laterally between the upper and lower integrated circuit components, the tape comprising:
      upper and lower surfaces;
      a plurality of carbon nanotubes extending vertically between the upper and lower surfaces and adapted to conduct electricity therebetween;
      an insulative base material laterally surrounding and in contact with the carbon nanotubes such that the carbon nanotubes are embedded in the insulative base material, the insulative base material adapted to electrically insulate the carbon nanotubes; and
      a lateral conductive connector disposed within the insulative base material and extending horizontally between the upper and lower surfaces and adapted to couple a first one of the carbon nanotubes with a second one of the carbon nanotubes,
      wherein each of the upper and lower surfaces of the tape comprises adhesive material configured and arranged for adhering to a respective one of the integrated circuit components, and
      wherein the lateral conductive connector is a carbon nanotube.

18. The device of claim 17, wherein at least some of the carbon nanotubes are spaced apart at a pitch of less than about 1 micron.

19. The device of claim 17, wherein at least some of the carbon nanotubes are spaced apart at a pitch of less than about 10 nanometers.

20. The device of claim 17, wherein the lateral conductive connector is laterally surrounded by the insulative base material.

21. The device of claim 17, wherein the first and second carbon nanotubes coupled by the lateral conductive connector are non-adjacent.

* * * * *